United States Patent [19]

Preuss

[11] Patent Number: 4,812,752
[45] Date of Patent: Mar. 14, 1989

[54] OPEN FINDER

[75] Inventor: Ernest A. Preuss, Roselle Park, N.J.

[73] Assignee: Allied-Signal Inc., Morris Township, Morris County, N.J.

[21] Appl. No.: 110,170

[22] Filed: Oct. 19, 1987

[51] Int. Cl.[4] .................. G01R 27/26; G01R 31/04; H03K 3/284

[52] U.S. Cl. ................... 324/542; 324/519; 324/520; 324/66

[58] Field of Search ............ 324/66, 61 R, 60 CD, 324/133, 539, 540, 542, 519, 520

[56] References Cited

U.S. PATENT DOCUMENTS

| | | | |
|---|---|---|---|
| 2,603,686 | 7/1952 | Lloyd | 324/542 |
| 3,502,971 | 3/1970 | Glosek | 324/542 |
| 4,103,225 | 7/1978 | Stephens | 324/60 CD |
| 4,173,736 | 11/1979 | Adams | 324/519 |

FOREIGN PATENT DOCUMENTS 845504  8/1960  United Kingdom ................ 324/519

Primary Examiner—Reinhard J. Eisenzopf
Assistant Examiner—Jose M. Solis
Attorney, Agent, or Firm—Howard G. Massung

[57] ABSTRACT

A circuit tester provides an indication of open circuit faults of individual conductors in cables. An oscillator circuit in the tesster includes a capacitance as an internal part of the circuit. Test probes connect conductor pairs to the oscillator circuit, thus changing the effective capacitance of the circuit. This changes the frequency output of the oscillator in accordance with the length of the conductors. Test indications may include a low pass filter and an audio circuit, or a circuit to convert frequency to a voltage or digitalized output. The tester may be used with automated test equipment.

14 Claims, 2 Drawing Sheets

OPEN FINDER

FIELD OF THE INVENTION

This invention relates to electrical test equipment for measuring electrical characteristics of circuitry. Specifically, the invention relates to finding circuit opens in bundled wires such as multi-wire harnesses and cable assemblies, in which the wires are tested from an end or connector of a wiring harness.

BACKGROUND OF THE INVENTION

Failures in multi-wire harnesses and cable assemblies most commonly are in the form of shorts or opens at or close to one of the connectors. It is advantageous to know at which connector the problem is located.

Shorts can be rather easily localized with the aid of a multimeter or equivalent, since the shortened end of that wired assembly will exhibit a lower pin-to-pin resistance than the read at the corresponding pins of another connector. Identifying which end of a conductor is open-circuited presents more of a challenge.

A viable approach to locating opens is to make use of the fact that wires bundled together will have measurable capacitance to one another. Experience has shown that interwire capacitance may be 30-300 pf. or more in a typical wired assembly. An open pin will have capacitance to its neighbors an order of magnitude lower, for example, 10 pf.

A capacitance meter rather reliably can distinguish open pins from wired ones, and hence could be used to determine which end of an open wire has broken away from its pin. A capacitance meter is relatively expensive, or might not be readily available when needed, regardless of cost. Furthermore, the time and "eyes off" distraction of reading such an instrument could be most inconvenient.

SUMMARY OF THE INVENTION

A tester places the interwire capacitance of any wire pair as a significant portion of the total capacitance in an oscillator circuit which normally yields a high frequency audio tone at minimum capacitance. Normally connected pairs of pins would produce a noticeable lowering of the frequency of the tone. The lowering of frequency is accomplished by a distinct amplitude enhancement of the output tone. If any pin were not connected to a wire, the change in frequency and amplitude would be minimal.

The operator would experimentally note the nominal frequency and amplitude effect produced by a pair of wired pins in a given cable or harness. She would then use one of those pins as a reference connection and proceed to probe the other pins, particularly any suspected as being open. If a given pin thought to be open to another point or points in the assembly produces a similar audio effect, the open connection is undoubtedly someplace else in the assembly. A probing of the other end of the harness would reveal an end of the open fault, and hence location of the fault.

The practical implementation of such a device includes:

1. Low cost.
2. Minimization of current drain, an important factor in any battery operated device.
3. Limitation of the effects of unexpectedly high interwire capacitance of extra long wiring beyond that anticipated.
4. Minimization of the effects of parallel resistance due to wiring leakage or even operator's body resistance.
5. Requirement of reduced operator technical expertise.

In a further aspect of the present invention, a switching circuit such as that used by computer automated test equipment (ATE) is connected to an audio oscillator circuit which uses a reference capacitor and capacitor of a wiring harness in order to complete an oscillator circuit. The output of the audio oscillator, as affected by the multiple connections at a connector, is provided to an analogue to digital converter and the switching circuit is able to compare the different values represented by the switched circuit connections. When one terminal appears to have an unusual capacitance, the ATE is than able to "squawk" that terminal as having a possible circuit fault.

DETAILED DESCRIPTION OF THE PREFERRED EMBODIMENTS

Figure 1:
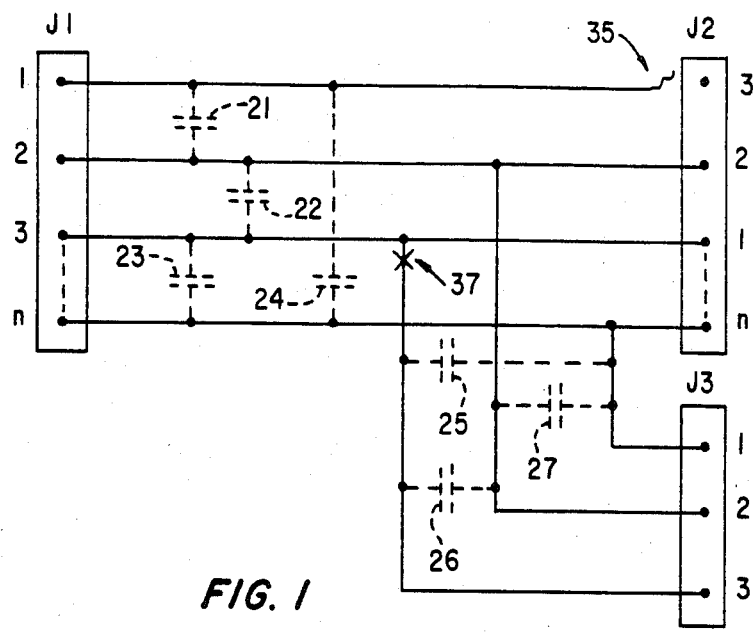
FIG. 1 is a schematic representation of a wire harness assembly.

FIG. 1 schematically shows a wiring harness, in which a plurality of conductors extend between connectors J1-J3. Because of the close proximity of conductors in a cable or wire bundle, there exists an interline capacitor between the conductors, represented in by dashed lines at 21-27. The values of these capacitances are subject to a wide variety of factors and are generally not known with any degree of precision. A primary factor in the determination of these inner wire capacitance 21-27 is the length of the associated conductors. Thus, a fault in one of the conductors will result in a change in the capacitance of that conductor. For example, if an open fault appears, as indicated at 35, terminal 3 at J2 will exhibit reduced capacitance with adjacent terminals. Terminal 1 of J1, at the opposite end of the affected conductor, will show little effect on capacitance, unless the loose end results in a short circuit with one of the other conductors. It can be readily seen that measuring the capacitance at the different connectors results in a quickly locating the fault, particularly an open fault, without a requirement that the lines themselves be traced.

There are many instances in which the inter-conductor capacitances are generally uniform. For example, in the diagram shown, the connections at connector J3 would have similar capacitances, based on the length of the total wire runs of their associated conductors. Thus, if an open fault occured mid-run, as at 37, capacitance changes would be noted. In this case, a capacitance change would be noted at terminal 3 of connector J3. Terminal 3 of J1 would also show reduced capacitance as compared to terminal 2 but, unless it was known that this particular circuit included the additional wiring to connector J3, the fault would not be noticeable at connectors J1 and J2 unless the relationship of the individual connectors with the wiring diagram is known.

Figure 2:
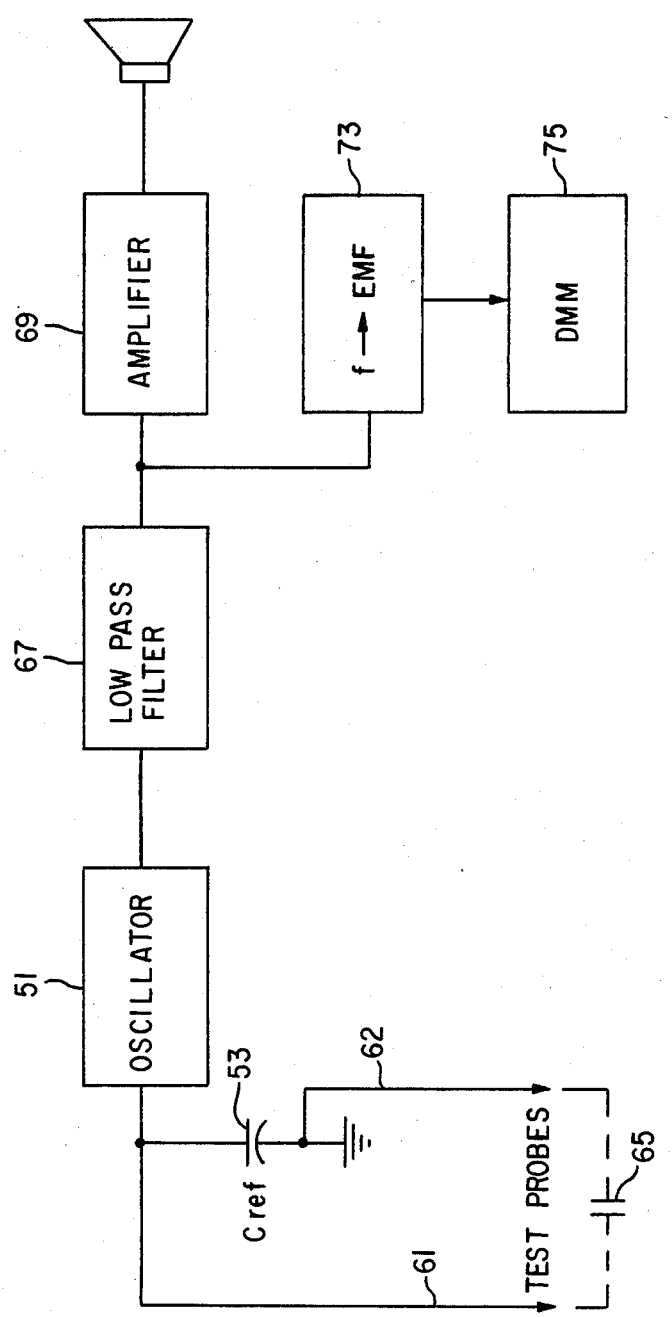
FIG. 2 is a schematic block diagram showing one embodiment of the invention.

FIG. 2 schematically shows a circuit for testing wire faults in cables. An oscillator 51 includes, in its circuit, a reference capacitor 53 and a pair of test probes 61,62. If the test probes 61,63 are connected across a circuit having a capacitance 65, the total capacitance of the oscilator circuit changes, thereby changing the output of the oscillator 51. If the oscillator 51 is caused to provide an audio frequency output, listening to the audio frequency output would provide an indication of changes in capacitance when the test probes 61,62 are connected to terminals at a connector, such as the terminals at connector J1 in FIG. 1. The change in frequency of the oscillator output is dependent upon the capacitance of the lines, and consequently is dependent on the actual length of the conductors, particularly where bundled. The reference capacitor 53 is considered to be an internal capacitance, even though it may be physically located outside of the tester's case, because the capacitor 53 is part of the oscillator circuit prior to the test probes 61, 62 being applied to conductors.

A low pass filter 67 and amplifier 69 can be used to provide more of an audio "feel" for wires of the unit under test (U.U.T.). When the test probes 61,62 are not connected to an appropriate pair of connectors, the output of the amplifier 69 will be in a quiescent state, because the low pass filter 67 filters the output of the oscillator 51 with only the reference capacitor 53 in the circuit. When an appropriate pair of wire runs is added to the circuit by the test probe 61,62 contacting appropriate connector terminal pairs, an output of the amplifier 69 will be present. Like capacitances, at 65, will provide like output frequency levels at the amplifier 69. An unusual capacitance 65 would be noted by a different output at the amplifier 69. By contacting successive terminal pairs, each complete pair would create a sound consistent with its associated wire runs.

It is possible to provide a numerical output for the circuit. This can be done by converting the output of the filter 67 to a voltage output, as shown in block 73. A voltmeter 75 can than be used to indicate relative response of each conductor pair. This is significant because in many cases, like wiring harnesses are going to provide like results which can be compared. Thus, if a connection between identical terminal pairs in successive harnesses provide significantly different readings, a quantitative determination of a fault can be had.

Figure 3:
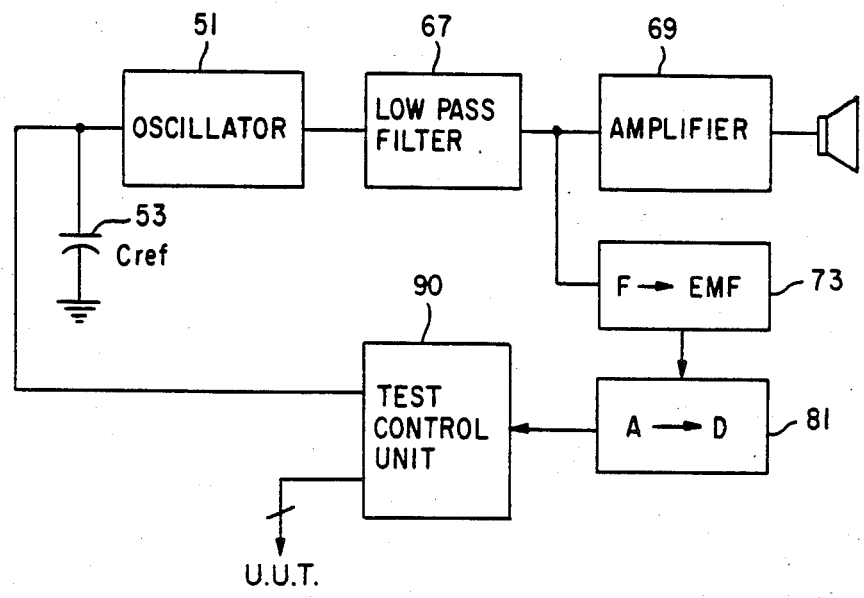
FIG. 3 is a schematic block diagram showing the invention as applied to automated test equipment (ATE).

This quantitative evaluation of wire faults permits automated testing, as shown in FIG. 3. As shown in that Figure, the oscillator 51 and low pass filter 67 provides filtered output to the frequency to voltage converter 73. This output is than digitalized, as shown in block 81 and the digital value is provided to a test control unit 90. The test control unit is standardized equipment tester, such as the Bendix 9070 Herbie portable module tester, available from Allied-Signal Inc., Test Systems Division, Teterboro, NJ 07608, the assignee of the present invention. The test control unit 90 selects individual terminations of a wiring harness of a unit under test (U.U.T.) these terminations are connected to the oscillator 51 much in the manner that the manual unit of FIG. 2 uses test probes. Since most of the wiring harnesses of a particular piece of equipment are connected to the test control unit in order to test the equipment, control unit 90 has the appropriate connector hardware to contact the wiring harnesses.

It is, of course, possible to provide a single tester which can be used with automatic test equipment such as test control unit 90 and which may be operated manually. In such a case, the test control unit 90 would be disconnected and test probes be attached to the oscillator input and to ground. Thus, the same tester can be used manually or with automated test equipment by field technicians.

It is anticipated that various modifications to the present equipment will be made, the above description applying to specific embodiments. Accordingly, the invention should be ready only as limited by the claims.

I claim:

1. Apparatus for detecting and locating open circuit faults in a cable bundle having a plurality of conductors and a first and second end, comprising:
   (a) an oscillator having a frequency of oscillation at an output and two output terminals, one to be connected to one of said conductors and the other to be connected to a second of said conductors so as to modify said frequency of oscillation according to the capacitance between said two input terminals so that said oscillator will have a modified frequency of oscillation at said output,
   (b) a filter having an output and an input connected to said output of said oscillator, said filter alternating said frequency of oscillation, and
   (c) means for indicating the frequency at said output of said filter, which means for indicating can be interpreted to detect and locate open circuit faults in the cable.

2. The apparatus as in claim 1, wherein said filter outputs said modified frequency of oscillation when said two input terminals are connected.

3. The apparatus as in claim 1, wherein said filter is a low pass filter.

4. The apparatus as in claim 1, wherein said filter amplifies said modified frequency of oscillation.

5. The apparatus as in claim 1, wherein said means for indicating is a speaker.

6. The apparatus as in claim 5, wherein said speaker generates a sound having a tone which is related to the frequency at said output of said filter.

7. The apparatus as in claim 5, wherein said speaker generates a sound when said two input terminals of aid oscillator are connected to said cable bundle, said sound having a tone which is related to the capacitance between said two input terminals.

8. The apparatus as in claim 1, wherein said means for indicating comprises a frequency to voltage converter and a voltmeter.

9. The apparatus as in claim 8, wherein said voltmeter indicates a voltage which is related to the frequency at said output of said filter.

10. The apparatus as in claim 8, wherein said voltmeter indicates no voltage when said two input terminals are unconnected and indicates a voltage related to the capacitance between said two input terminals when said two input terminals are connected.

11. The apparatus as in claim 1, wherein said means for indicating is activated when said two input terminals are connected.

12. A method for testing a cable bundle comprising a plurality of conductors to locate an open circuit in a first conductor in said cable bundle by using a tester having two input terminals and a filtered output dependent on the capacitance between said input terminals, said open circuit having been detected by checking said plurality of conductors for continuity, said method comprising the steps of:
(a) connecting each of said input terminals to a second and a third conductor within said cable bundle at a first end of said cable bundle,
(b) noting said output of said tester,
(c) connecting one of said input terminals to said first conductor at said first end of said cable bundle,
(d) noting said output of said tester, and
(e) locating said open circuit in said first conductor at said first end of said cable bundle if said output from step (d) is notably different from said output step (b).

13. A method as in claim 12, further comprising the steps of:
(f) connecting each of said input terminals to a second and a third conductor within said cable bundle at a second end of said cable bundle,
(g) noting said output of said tester,
(h) connecting one of said input terminals to said first conductor at said second end of said cable bundle,
(i) noting said output of said tester, and
(j) locating said open circuit in said first conductor at said second end of said cable bundle if said output from step (i) is notably different from said output from step (g).

14. A method as in claim 12, wherein said output of said tester is a frequency.

* * * * *